(12) United States Patent
Wölfel

(10) Patent No.: US 8,076,612 B2
(45) Date of Patent: Dec. 13, 2011

(54) METHOD FOR THE CONTINUOUS LAYING OF A CONDUCTOR ON A PRINTED CIRCUIT BOARD AND DEVICE FOR CARRYING OUT SAID METHOD

(75) Inventor: Markus Wölfel, Lauf (DE)

(73) Assignee: Jumatech GmbH (DE)

( * ) Notice: Subject to any disclaimer, the term of this patent is extended or adjusted under 35 U.S.C. 154(b) by 954 days.

(21) Appl. No.: 11/814,412

(22) PCT Filed: Jan. 24, 2006

(86) PCT No.: PCT/EP2006/000616
§ 371 (c)(1),
(2), (4) Date: Sep. 12, 2007

(87) PCT Pub. No.: WO2006/077167
PCT Pub. Date: Jul. 27, 2006

(65) Prior Publication Data
US 2009/0288762 A1  Nov. 26, 2009

(30) Foreign Application Priority Data

Jan. 24, 2005 (DE) .......................... 10 2005 003 370

(51) Int. Cl.
| | |
|---|---|
| *B23K 9/00* | (2006.01) |
| *B23K 11/16* | (2006.01) |
| *H01R 43/00* | (2006.01) |
| *H05K 3/02* | (2006.01) |

(52) U.S. Cl. ..................... 219/137 R; 219/56; 219/56.1; 219/56.22; 29/825; 29/846

(58) Field of Classification Search ..................... 219/55, 219/56, 56.21, 56.22; 29/825, 843, 846, 29/850; 228/4.1, 4.5, 179.1–180.5
See application file for complete search history.

(56) References Cited

U.S. PATENT DOCUMENTS

| | | | | |
|---|---|---|---|---|
| 3,296,692 | A | * | 1/1967 | Griffin .................... 228/122.1 |
| 3,960,309 | A | * | 6/1976 | Hazel ......................... 228/5.1 |
| 4,543,462 | A | * | 9/1985 | Rossell ..................... 219/91.21 |
| 5,097,100 | A | * | 3/1992 | Jackson ..................... 174/94 R |
| 5,110,032 | A | * | 5/1992 | Akiyama et al. .............. 228/102 |
| 5,138,127 | A | * | 8/1992 | Fries et al. .................. 219/86.51 |
| 5,189,275 | A | * | 2/1993 | Avellino et al. ............. 219/56.22 |
| 5,324,910 | A | | 6/1994 | Isawa |

(Continued)

FOREIGN PATENT DOCUMENTS

DE  3126109 A1  1/1983

(Continued)

OTHER PUBLICATIONS

International Search Report for International Application No. PCT/EP2006/000616, mailed Aug. 22, 2006, 3 pages.

(Continued)

*Primary Examiner* — Stephen Ralis
(74) *Attorney, Agent, or Firm* — Cantor Colburn LLP

(57) ABSTRACT

A method provides for welding a conductor to a conductive film which is suited for connection to a circuit board support in order to produce a printed circuit board. The depth or diameter of the conductor is preferably greater than the thickness of the conductive film. At least during the welding process, the conductive film is maintained in contact with a thermal isolation plate having a thermal conductivity less than that of the conductive film. After being placed on the circuit board support, the conductive film is partly etched away to electrically isolate electrical contact points.

25 Claims, 4 Drawing Sheets

U.S. PATENT DOCUMENTS

| | | | |
|---|---|---|---|
| 6,640,436 B1 * | 11/2003 | Kimura et al. | 29/867 |
| 6,705,511 B1 * | 3/2004 | Dames et al. | 228/180.5 |
| 6,797,910 B2 * | 9/2004 | Maeda | 219/56.22 |
| 6,810,580 B2 | 11/2004 | Yamaguchi et al. | |
| 6,881,291 B2 | 4/2005 | Platz | |

FOREIGN PATENT DOCUMENTS

| | | | |
|---|---|---|---|
| DE | 4022664 A1 * | 1/1992 | |
| DE | 10216526 A1 | 11/2002 | |
| DE | 10317879 A1 | 11/2004 | |
| JP | 61053789 A2 | 3/1986 | |
| JP | 63-000195 A | 1/1988 | |
| JP | 5185244 | 7/1993 | |
| JP | 2001126942 | 11/2001 | |
| JP | 2002233033 | 8/2002 | |
| JP | 2004063800 | 2/2004 | |
| RU | 1696215 A1 * | 12/1991 | |

OTHER PUBLICATIONS

English Language Abstract of JP 2001-126942.
English Language Abstract of JP 2002-233033.
English Language Abstract of JP 2004-063800.
Machine translation of Japanese Patent Publication 2001-126942, 14 pages.
Machine translation of Japanese Patent Publication 2002-233033, 11 pages.
Machine translation of Japanese Patent Publication 2004-063800, 11 pages.
English translation of official action dated Jul. 26, 2011, in corresponding Japanese Patent Application No. 2207-551637, 4 pages.
Partial English translation of Japanese Patent Document JP 63-000195, published Jan. 5, 1988, 2 pages.

* cited by examiner

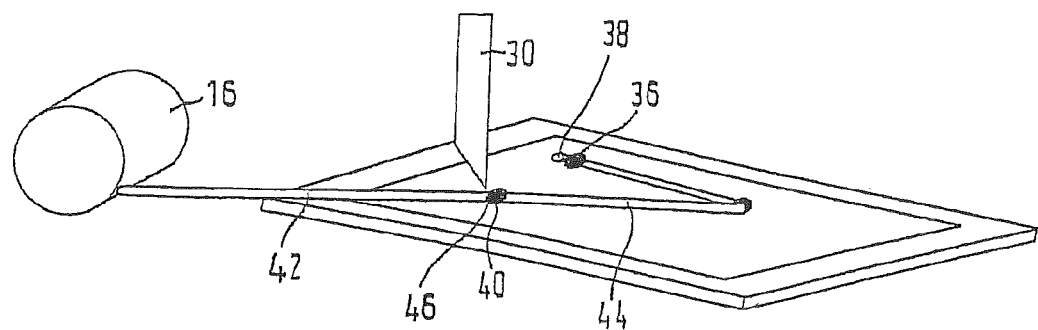
FIG.5
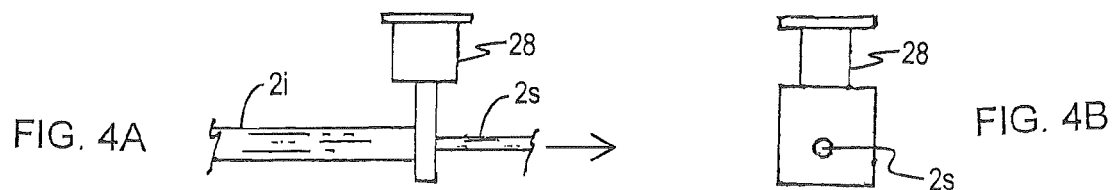
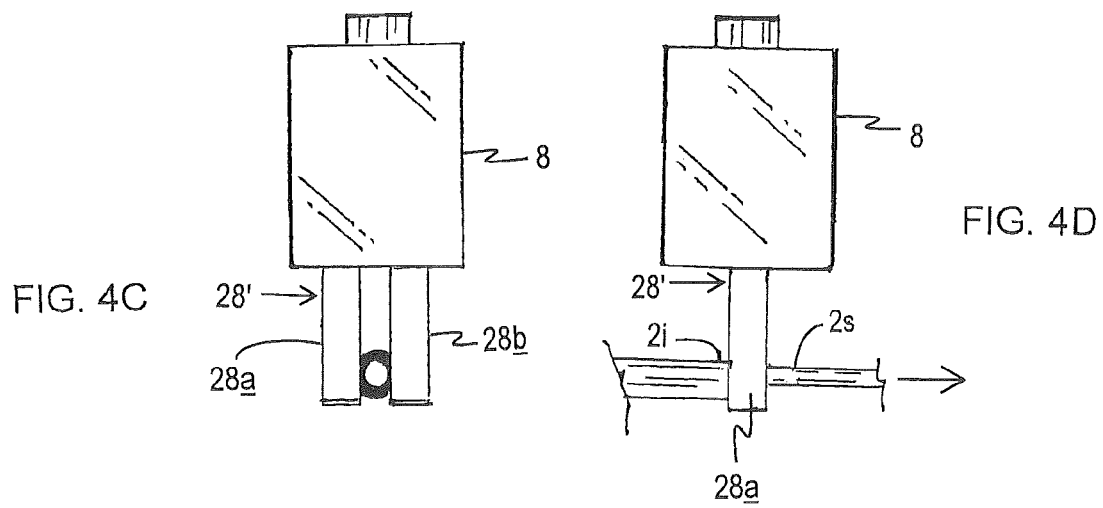

METHOD FOR THE CONTINUOUS LAYING OF A CONDUCTOR ON A PRINTED CIRCUIT BOARD AND DEVICE FOR CARRYING OUT SAID METHOD

The invention relates to a method for welding a conductor to a conductive film, which is preferably connected to a circuit board support in order to produce a printed circuit board, the depth or diameter of the conductor being preferably larger than the thickness of the conductive film in accordance with the generic term of Claim 1, as well as to a device for carrying out this method.

Normally, signals and currents on printed circuit boards for electrical and electronic circuits are transmitted through strip conductors that are produced by means of an etching procedure, i.e., the areas of copper film applied to a support board are etched away between the required strip conductors and consequently electrically separated from one another, and the copper film is retained at only the required places. Because the depth of the copper film and the cross-section of the strip conductors that can be created by means of this method are limited, due in part to the component density and the wiring density and the technical capabilities of the etching procedure, the transmission of higher currents here and also routing, particularly in the case of one-layer or two-layer circuit boards, are often inadequate or impossible according to this method, particularly when demanding technical specifications are stipulated.

DE 101 08 168 C1 describes a method for producing a multi-wire printed circuit board with the application of a wire-printing method, wherein appropriate conductors are laid in a defined manner on the interior side of a thin surface element made of electrically conductive wire-printing material, and contacted and fixed at defined contact points of the surface element. Then a stabilisation surface element is fixed on the interior side of the surface element with the contacted conductors. After this, the thin surface element is structured from its exterior side in such a way that the contact points are separated from the rest of the surface element and consequently electrically isolated from one another. Such printed circuit boards of limited thickness can be put together into a compact multilayer circuit.

A number of disadvantages found in conventional printed circuit boards can be avoided by the method described in DE 101 08 168 C1. However the weldability of, for example, thick wires on to thin copper films was limited until now according to the method described in DE 101 08 168 C1. Therefore, it was a matter of concern to further improve the spectrum of weldable conductors on to thin, conductive films and the welding quality and welding reliability to be achieved thereby, particularly in the welding of thick conductors on to thin, conductive films, and largely to maintain the effective conductor cross-section progression in the area around the welding points, without interference with the conductive film in the welded region.

The object of the invention under consideration is therefore to specify a method for welding a conductor to a conductive film, which is preferably connected to a circuit board support in order to produce a printed circuit board, the depth or diameter of the conductor being preferably larger than the thickness of the conductive film, whereby such method can be realised in a simple and economical manner, can be used industrially in automatic wire-printing machines and considerably improves the methods known until now, particularly in the manner previously described.

This object is solved according to the invention by a method for welding a conductor to a conductive film according to the generic term of Claim 1, wherein the conductive film is in contact with a thermal isolation plate, at least during the welding process, the thermal conductivity of said plate being lower than that of the conductive film.

According to the device aspect of the invention under consideration, the object in accordance with Claim 26 is solved by means of a device for carrying out the method according to the invention, which comprises at least the following devices which are numerically controlled by an electronic control device:

a) A device (8, 10, 14) for producing a relative movement between a conductive film (4) and a conductor storage unit (16), b) A device (24) for integral connection of the conductor (2) to electrical connection points (36, 40) on the conductive film (4).

By means of the method according to the invention, it is possible, in an advantageous manner, to weld a large spectrum of conductors to the copper films found in the application customary in the electronics area, with typical sizes between 18 μm and 70 μm, and to lead the conductors in a protected manner and embedded in the interior of the printed circuit board. In this process, particularly conductors with round or rectangular cross-sections are used whose diameter or depth is, for example, a factor of 2 to 10 time greater than the thickness of the conductive film. Furthermore, the method according to the invention can also be advantageously used for copper films with a thickness of several hundred μm. A further advantage is the high level of reliability and quality of the welding that can be achieved by means of the method according to the invention. Furthermore, with the method according to the invention, the effective cross-section progression available for the current flow in the area of the welding point can be largely maintained, so that the formation of so-called "hot spots" can be avoided. In addition, welding that is mechanically and chemically very resistant with respect to unfavourable ambient conditions can be achieved. As a result of the large spectrum of weldable conductors and the great deal of freedom in the selection of the conductive film, the method according to the invention allows the development of new application areas, particularly in the power and high-current area, but also in combination with power electronics, such as with precision electronics, highly-integrated electronics and/or high component densities. A further advantage is the high welding speed and very good industrial applicability, for example with numerically controlled wire-printing machines.

In a preferred embodiment, the thermal conductivity of the thermal isolation plate, at least in a region lying around the welding area, can be less than that of the conductive film by at least a factor of 2, preferably by at least a factor of 5. In this way, it is possible to achieve particularly good welding quality by the controlled removal of the heat that arises during welding.

In a further preferred embodiment, the thermal isolation plate can have a melting temperature and thermal stability greater than that of the conductive film and/or the temperature load during the welding process, as a result of which softening of the isolation plate, connection of the isolation plate to the conductive film and/or unfavourable physical-chemical interaction between the thermal isolation plate and the conductive film are avoided during the welding.

In a further preferred embodiment, the thermal isolation plate can have a coating with greater thermal stability and/or lower thermal conductivity than the base material, at least in a contact area to the conductive film lying around the welding area, preferably in the entire contact area of the conductive film. By means of the application of such a coating, the characteristics of the thermal isolation plate can be further improved and the body of the isolation plate can be produced from a material that differs from the coating, as a result of which the characteristics of the body and coating are optimised to a higher degree and can be even better adapted to process control during welding.

According to a further preferred embodiment, the thermal isolation plate can have an inert surface, preferably in the form of an inert coating, at least in a contact area to the conductive film lying around the welding area, preferably in the entire contact area. By means of such an inert surface or inert coating, it is firstly possible to avoid a surface change, resulting from the welding process, in the thermal isolation plate in contact with the conductive film and/or the ambient air and/or other present materials during the heating and, secondly, a physical, physiochemical and/or chemical bond between the conductive film and the thermal isolation plate can be prevented.

In a further preferred embodiment, the thermal isolation plate can be electrically conductive, preferably highly conductive, as a result of which the thermal isolation plate can be used for the transmission and/or conductance of the welding current, resulting in an improved welding result.

In a further preferred embodiment, the thickness of the thermal isolation plate can preferably be greater than that of the conductive film by at least a factor of 5 and by a factor no greater than 300. In this way, favourable conditions result with respect to the thermal isolation and the current conductance.

In a further preferred embodiment, the thermal isolation plate can be arranged between the conductive film and a power distribution device, preferably made of a copper block. By means of such a sandwich arrangement of the thermal isolation plate, in which a copper block with a greater thickness (for example, ten times as thick as the thermal isolation plate) is arranged on the side of the thermal isolation plate opposite the conductive film, uniform distribution and discharge of the welding current can be guaranteed.

In a further preferred embodiment, the depth or the diameter of the conductor to be welded can preferably be greater than the thickness of the conductive film by a factor of 2 to 10. By using such thick conductors, it is possible to manufacture high-power circuit boards with conventional thin thicknesses of the conductive film, for example 18-70 μm.

In a further preferred embodiment, a further component, made of a metal other than that in the wire and/or circuit board, can be introduced at the welding point. By introducing such a component, a homogenous eutectic phase in a microalloy range forms during the welding process by means of diffusion processes, as a result of which the connection temperature and the connection stability are favourably influenced.

In a further preferred embodiment, the wire can have at least one additional metallic component differing from the wire and/or board, preferably in the form of a metallic coating, particularly one of silver or tin. In this way it is possible to make accessible the advantages of the previous embodiment in a variant that is technically particularly simple and useful.

In a further preferred embodiment, the welding can be carried out by means of a contact welding method, whereby in this way, particularly exact monitoring and control of the welding parameters, locally concentrated heating and a particularly high quality welding result can be guaranteed.

In a further preferred embodiment, the counter-electrode can be arranged opposite the welding electrode with reference to the level of the board. By means of such a continuous welding method, higher welding currents can be used, which can be advantageous for the welding of particularly thick conductors to thicker conductive films.

In a further preferred embodiment, two welding-current-conducting electrodes are arranged between the conductive film and the thermal isolation plate on the same side with respect to the level of the contact surface. In this way, the welding current supply and the welding current removal can be done from the same side, namely the processing side of the conductive film, and independently of the conductivity conditions of the thermal isolation plate.

In a further preferred embodiment, two welding electrodes can be positioned with respect to the conductor in such a way that as a result a stronger focusing of the welding current at the place of the welding can be made.

In a further preferred embodiment, the counter-electrode can be formed as a surface electrode and arranged on the same side with respect to the level of the plate of the welding electrode. In this way, it is possible, for example, to carry out welding of even thick conductors when an electrically non-conductive or poorly conductive thermal isolation plate is used.

In a further preferred embodiment, the insulation can be stripped from an insulated conductor by means of thermal melting and/or by means of mechanical removal or stripping or pinching, preferably by means of thermal melting using a laser or by means of burning using the welding electrodes. In this way, it is possible to use insulated conductors for the wire-printing that reliably avoid, at undesirable places, an electrical contact with the conductive film or with other conductors at crossed areas and/or that achieve higher isolation levels. By means of the method described in this embodiment, such wires can be laid and contacted to the conductive film in an economical and efficient manner by means of automatic wire-printing machines with the method according to the invention.

In a further preferred embodiment, the melting off of the insulation can be carried out by an electrode pair that can be positioned with respect to the conductor, preferably while process parameters are controlled and monitored. In this way, the insulation of insulated conductors can be removed in a particularly quick, simple and economical manner, without the use of a laser or a conductor stripping device.

In a further preferred embodiment, the polarity direction of the electrode pair that can be positioned with respect to the conductor can be changed periodically during the stripping. In this way, uneven electrode burn-off during the stripping process can be avoided.

In a further preferred embodiment, an electrode pair that can be positioned with respect to the conductor can have the same polarity and be connected in parallel for continuous welding. In this way, it is possible to carry out the stripping process of the conductor and the welding of the conductor to the conductive film carried out in the continuous contact welding method extremely quickly, economically and efficiently, with the same electrode pair, without repositioning.

In a further preferred embodiment, the conductor can be tensed and held down, at least during the welding process, by a pressing device. By the use of such a pressing device, the conductor can be prevented from lifting up or stretching during the welding process, and it is possible to avoid inaccurate laying of the conductor, particularly after the separation of the conductor from a conductor-feeding device, and to avoid poor welding.

In a further preferred embodiment, the conductor can be glued down in spots, preferably at spots at which the conductor-laying direction is changed. In this way, accurate and flat laying of the conductors can be guaranteed by means of the conductors being fixed in place in this manner, and consequently "orthogonal wire-routing" can also be carried out, or unfavourable conductor crossings or juxtapositions or the laying of conductors in, for example, bore hole areas or via areas can be avoided. In this process it is possible both to apply the adhesive selectively at the positions specified in the wiring or wire-routing layout during the wire-printing but already before the positioning of the conductor or in a previous operational step or to equip, or to equip or prefabricate the conductive film with a fixed adhesive point structure or adhesive surface structure and consequently to securely fix in place the subsequently laid conductors.

In a further preferred embodiment, the adhesive can be applied at the gluing points preferably by means of being dropped on, jetted on or sprayed on. In this way the adhesive can be applied locally with a great deal of precision and introduced between the conductor and the conductive film.

In a further preferred embodiment, it is possible to activate the adhesive by means of applying electromagnetic energy, preferably by means of UV radiation, and/or it is possible for the adhesive to be cross-linked and/or it is possible to accelerate the setting of the adhesive. By using such an adhesive, the setting times can be greatly reduced and held to less than a second in some cases, which is very advantageous for rapid wire-printing by machine.

In a further preferred embodiment, a method for continuously laying an insulated conductor between electrical contact points arranged on a printed circuit board can be carried out by means of a numerically controlled device, whereby this includes at least the following steps:
a) Stripping the insulation off of the conductor at a connection section intended for connection to a beginning connection point;
b) Production of relative movement between the printed circuit board and at least the connection section of the conductor, in order to position the connection section of the conductor at the beginning connection point on the printed circuit board;
c) Integral connection of the connection section of the conductor to the beginning connection point;
d) Production of relative movement between the conductor and the printed circuit board with a length of conductor that is to be laid being fed, in order to position a further connection section of the conductor at a further connection point on the printed circuit board;
e) Stripping the insulation off of the connection section of the conductor positioned at the further connection point;
f) Integral connection of the connection section of the conductor to the further connection point;
g) Continuation with steps d) to f) until such a time as the end connection point has been reached;
h) Separation of the laid length of conductor.

The order of steps a) and b) and/or the order of steps d) and e) can be exchanged. By means of such a method, prototype manufacturing, small series manufacturing and industrial manufacturing of wire-printed circuit boards can be carried out economically and efficiently.

The advantages to be accomplished with this method can particularly be seen in the fact that the wire-printing process is fully automated and no additional intervention by the operating personnel is necessary in order to produce a wire-printed printed circuit board created according to any specification. The conductor is furthermore continuously laid from the beginning connection point to the end connection point via any additional connection points without interruption, as a result of which any contact problems that arise are drastically reduced. With the method, any number of conductors can each be laid in a printable manner onto a conductive film between a beginning connection point and an end connection point, particularly even with one above the other in a number of layers.

More preferably, the relative movement between the conductor and the printed circuit board comes about by means of a movement of the printed circuit board within a horizontal plane relative to a conductor storage unit that holds the conductor. In addition, at least the connection sections of the conductor can be positioned relative to the printed circuit board. Such kinematics can be realised in a simple manner, for example by means of a cross table customary with machine tools, whereby said cross table is driven with respect to two axes arranged in one plane. At the same time, each axis can be given its own track positioning.

According to the device aspect for executing the method according to the invention, a number of embodiments are again conceivable, with a selection of these being described in the following.

In a preferred embodiment, the device can have a device for stripping the insulation from an insulated conductor. In this way, it is possible to use an insulated conductor, with the previously mentioned advantages of reliably avoiding undesired electrical contacting between conductors and surface strip conductors of the finished circuit board and among the conductors themselves, in connection with the previously mentioned automated procedure.

In a further preferred embodiment, the device can have a device for cutting off the conductor. As a result, reliable automatic trimming of the conductor can be carried out behind the connection point with the conductive film, in the direction in which the conductor is being laid.

In a further preferred embodiment, the device for producing the relative movement between the printed circuit board and the conductor storage unit can include a cross table that tenses the conductive film and that can be moved in at least two horizontal axes (X, Y), a supporting slide that can be driven relative to the cross table along a vertical axis (Z), the device for stripping the insulation off of the conductor, the device for the integral connection of the conductor to electrical connection points on the conductive film and the device for cutting off the conductor, and a pivot arm that can be driven in a pivoting manner by the controller with respect to the slide, whereby this pivot arm carries the conductor storage unit. In this way, a device that can be reliably and economically manufactured can be produced for executing the method according to the invention.

In a further preferred embodiment, the conductor storage unit can be formed by means of a conductor storage roll, which can, by means of the pivot arm, be pivoted at right angles to the momentary direction in which the conductor is being laid. In this way, the conductor unrolling device can be adjusted to the direction in which the conductor is being laid.

In a further preferred embodiment, it is additionally possible to include a device that can be driven by a control device for generating wire feed and that is attached to the pivot arm. By means of the selective wire feed, the tension of the conductor can be selectively adjusted to the requirements of optimal manufacturing quality and speed when it is spread out between the connection points.

Consequently, as a rule it is expedient to have the control device switch the device for generating the wire feed without torque while the conductor drive is printing, or to act upon it with only a slight torque, in order in this way to tense and lay the conductor after it has been fixed in place by means of welding to the first connection point in accordance with the routing plan. In order to catch and hold the conductor after it has been cut off from the laid or printed conductor section, the effective freewheel of the rolls of the wire feed device is lifted and consequently an uncontrolled unrolling of the conductor storage roll is prevented.

In a preferred embodiment, a gluing device that can be driven by the control device can be provided for gluing the conductor to the printed circuit board at points at which the conductor undergoes a change in direction. By means of such a drivable gluing device, gluing points can be selectively set, and so the precise laying of the conductors can be guaranteed by means of this type of fixing in place, in order, for example, to carry out so-called "orthogonal wire-routing" or to avoid unfavourable crossings of the conductors or juxtapositions of the conductors or to avoid laying conductors in, for example, the area of bore holes or vias.

In a further preferred embodiment, the device can have a thermal isolation plate. In this way, especially high welding point quality can be achieved and the welding of a large bandwidth of conductor cross-sections and sizes can be reliably carried out on commercially available conductive films such as are intended for the manufacture of printed circuit boards.

In a further preferred embodiment, the device can have a device for tensing and/or holding down the conductor, by means of which an especially reliable and precise laying of the conductor and extensive avoidance of poor welding can be achieved.

The developments of the invention cited in the preceding represent only a selection of suitable design possibilities of the object of the invention that are laid down in the individual dependent claims. These special design possibilities can be applied individually or, as far as technically possible and expedient, also in combination of a number of the previously mentioned design possibilities with a method according to Claim 1 or to a device for carrying out the method in accordance with Claim 26.

In the following, the invention is explained in more detail by way of example using preferred embodiments in connection with the associated figures. Shown are:

FIG. 1 a perspective view of a device for laying an insulated conductor between areas of a conductive film provided for forming electrical connection points in accordance with a preferred embodiment of the invention;

FIG. 2 a schematic representation of the device shown in FIG. 1 during a production step;

Figure 1:
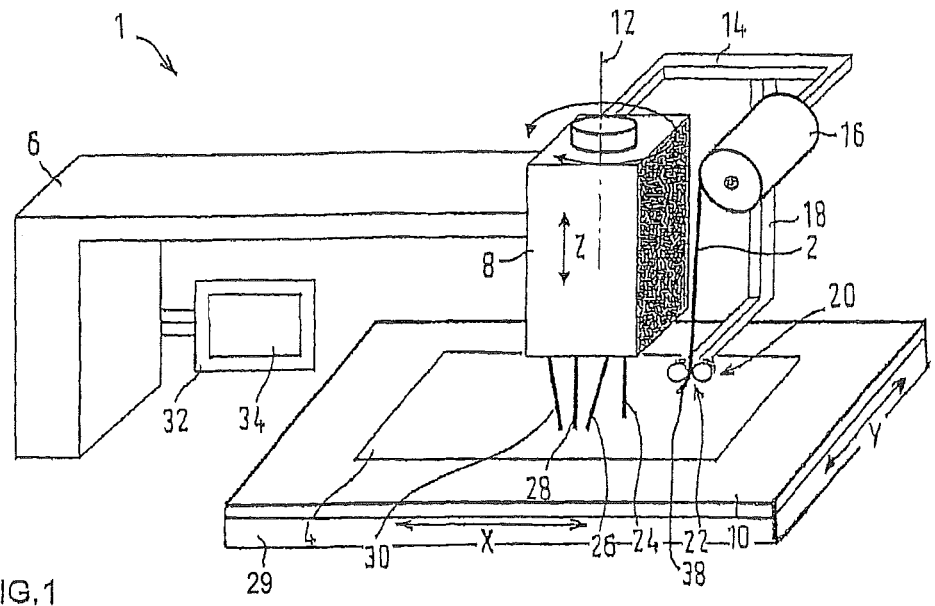
Figure 3:
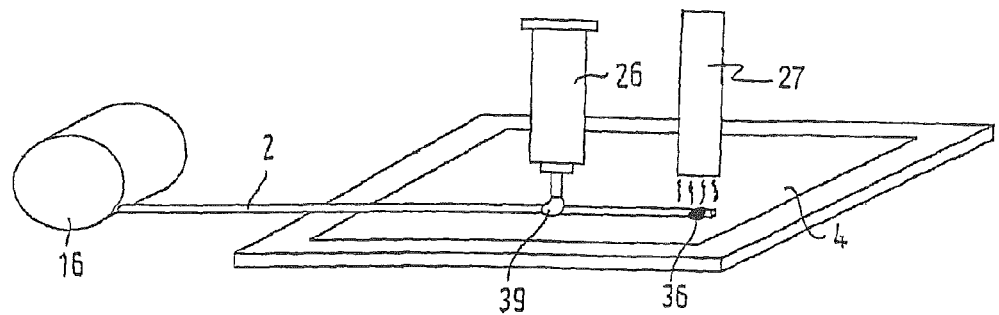
Figure 4:
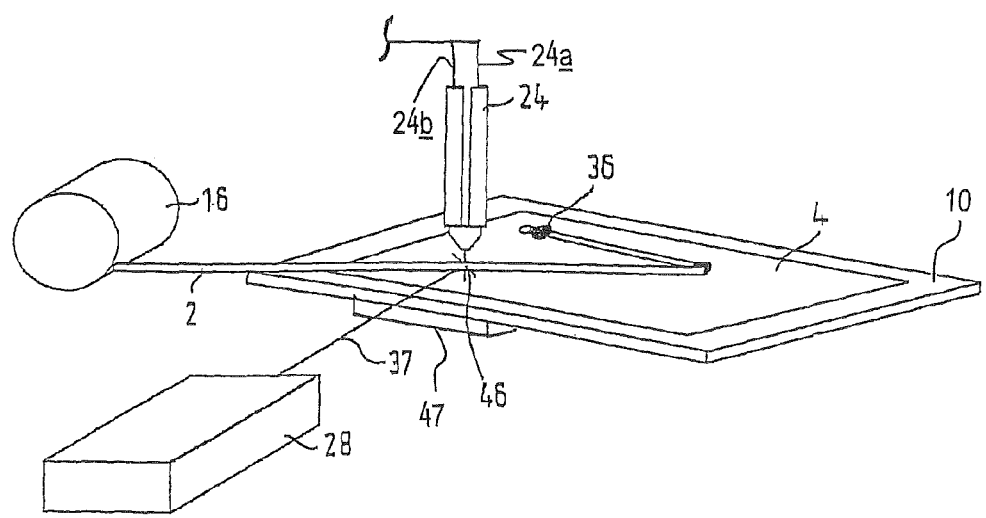
Figure 4E:
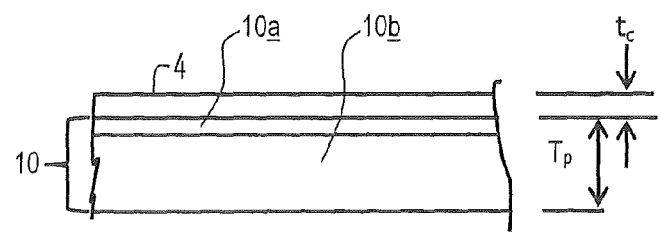

FIG. 3 a schematic representation of the device shown in FIG. 1 during an additional production step;

FIG. 4 a schematic representation of the device shown in FIG. 1 during an additional production step;

FIG. 4A is a schematic side elevation view of a mechanical stripper being used to mechanically strip insulation from a portion of a wire conductor, and FIG. 4B is a front elevation view thereof;

FIG. 4C is a schematic front view of a pair of electrodes being used to melt insulation from a wire conductor to strip insulation from a portion of the wire conductor, and FIG. 4D is a side elevation view thereof;

FIG. 4E is a schematic partial view in elevation of a coated thermal isolation plate with a conductive film thereon;

FIG. 5 is a schematic representation of the device shown in FIG. 1 during an additional production step; and FIGS. 6A, 6B, 6C and 6D are flow charts showing different sequences of the operating steps of the method described in the specification.

Figure 2:
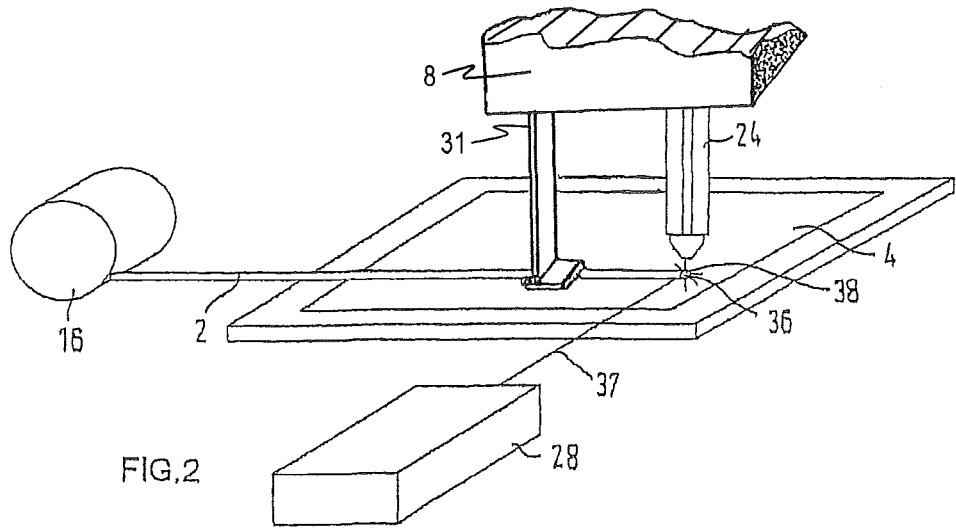
FIG. 2A is a partial elevation view showing a wire conductor disposed on a conductive film.
FIG. 2B is a cross-sectional view of a metal clad wire conductor.
Figure 2B:
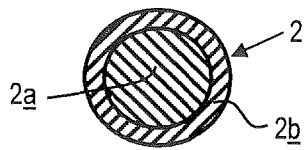
Figure 2A:
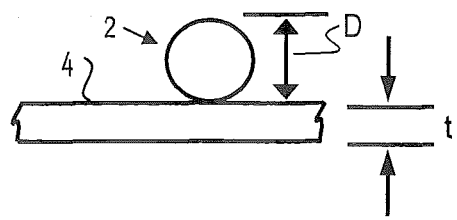

The device in FIG. 1, identified as a whole with 1, according to a preferred embodiment of the invention serves to lay a conductor 2 which can be surrounded by insulation, between at least two areas of a conductive film provided for the formation of electrical connection points, whereby said film, after connection to a circuit board support, is, together with this circuit board support, designated for the formation of a printed circuit board. These discrete areas that are designated for the formation of connection points are, in the same way as any strip conductors that may be provided on the circuit board, isolated in a subsequent step after connection of the conductive film to a circuit board support to form a printed circuit board, for example, by means of partially etching off or etching away the conductive film connected to the circuit board support, and so electrically isolated from one another. The term "connection point" is this regard is to be understood in the broadest sense, i.e., it should include all electrical connection possibilities of a conductor 2 on the conductive film 4 for lamination of a printed circuit board or to contacting areas arranged on the conductive film or on a carrier film or on the contact structures or conducting structures, electrical or electronic components, mechanical components or other structures arranged on the printed circuit board to be produced and suitable for the connection of conductors 2. As seen in FIG. 2A, the depth or diameter D of wire conductor 2 (which may be square or rectangular in cross section) is greater than the thickness t of conductor film 4.

The conductive film 4 is tensed on to a cross table via a thermal isolation plate 10 and so can be positioned with respect to a slide 8 that can be moved on a supporting stand 6 in a horizontal plane, for example, by means of the cross table being driven with regard to two axes X and Y arranged in the horizontal plane. At the same time, each axis can be given its own track positioning. As seen in FIG. 1, thermal isolation plate 10 is supported on a cross table 29 which, as indicated by the bi-directional arrows X and Y may move in either direction along the X and Y axes. This enables positioning conductive film 4 horizontally in any relationship to slide 8 and the devices thereon. Slide 8 (FIG. 2) may have a pressing device 31 mounted thereon in order to tense and smooth wire 2 for welding onto conductive film 4.

The supporting stand 6 is attached to a frame of the device 1 and formed, for example, with an L-shape. The slide 8 can be driven on this supporting stand 6 along a vertical Z-axis, which can likewise be developed with track positioning. A pivot arm 14 that can be pivoted around a vertical pivot axis 12 and that has a rotating drive is supported on the slide 8 on a pivot bearing, whereby said pivot arm 14 bears a conductor storage roll 16 on which a certain quantity of conductor 2 is rolled up. The pivot arm 14 furthermore supports a wire feed and adjustment device 20 on an extension arm 18 that extends downwards vertically in the direction of the printed circuit board 4, whereby said wire feed and adjustment device 20 can roll the conductor 2 from the conductor storage roll 16. This function is realized by, for example, two driven rolls 22 which advance or withdraw the conductor 2 guided between them, depending on the rotation direction. Furthermore, these rolls 22 can also be switched into freewheel movement or can be braked in a defined manner, in order to exert no resistance or a small defined resistance on the conductor 2 when this is unwound from the conductor storage roll 16 after being attached to a connection point on the printed circuit board 4 by means of a movement of the cross table relative to the wire feed and adjustment device 20 which then merely guides it.

Furthermore, the slide 8 bears, for example, on its front face that faces the conductive film 4 a device for integral connection of the conductor to the electrical connection points on the printed circuit board, which is realised, for example, by means of a welding device 24 (FIGS. 1 and 2) with welding head. A further metallic component 33 may be introduced into the welding. As illustrated in FIG. 2B, this may be accomplished by providing the core 2a of conductor 22 with an outer cladding 2b of the at least one additional metallic component. The wires 24a, 24b connect the electrodes of welding device 24 in parallel. Furthermore, a gluing device 26 for gluing conductor 2 on to the conductive film 4, preferably with quick-drying UV glue, a stripping device 28 for stripping the insulation from the conductor 2 by means of, for example, a thermal procedure using laser or by means of burning it off using the welding electrodes or by means of a mechanical process by means of appropriately arranged cutting blades or rotating cutting rollers or by means of pressure pinching or scraping pinching using the welding electrodes, as well as a separating device 30 for separating the unwound conductor 2 from the remaining wire still on the conductor storage roll 16. Furthermore, the device comprises a pressing device 31 (FIG. 2) by means of which the conductor 2 can be reliably tensed and held down until being welded, for example, even after its separation from the remaining wire 42 on the conductor storage roll 16. FIG. 2A shows that the depth or diameter D of conductor 2 is greater than the thickness t of conductive film 4. FIG. 2B shows wire conductor 2 having a core 2a and a cladding of a different metal 2b.

As shown in FIG. 3, a source of electromagnetic energy 27 may be used to accelerate the curing of the adhesive by means of applying electromagnetic energy to the adhesive, preferably UV radiation.

FIG. 4 shows thermal isolation plate 10 arranged between the conductive film 4 and a power distribution device 47, which may comprise a copper block. FIGS. 4A and 4B show a conductor 2i having an insulation jacket thereon being passed through a mechanical stripping device 28 which removes the insulation therefrom, leaving an exposed section 2s which has been stripped of insulation. FIGS. 4C and 4D show a stripping device 28' comprising a pair of electrodes 28a, 28b which serve to strip the insulation from the portion 2i of the conductor, which has an insulation jacket thereon, by melting the insulation to leave an exposed, stripped portion 2s of the conductor. In FIGS. 4C and 4D, the electrodes 28a, 28b are shown as being covered by slide 8, but obviously they may be mounted in any suitable fashion. FIG. 4E shows a thermal isolation plate 10 comprising a base 10b having a coating 10a thereon. The coating is selected to have suitable properties so that the properties of thermal isolation plate 10 may be tailored to specific needs. The thickness $T_p$ of thermal isolation plate 10 is seen to be greater than the thickness $t_c$ of conductive film 4.

The named devices 24, 26, 28, 30 preferably arranged frontally on the slide 8 have, in their base position, a certain vertical distance from the conductive film or from the areas on this conductive film 4 intended as connection points, so that the distance or the contact with the respective working point that is needed for the respective processing step is not produced until after the slide has been driven along the vertical Z-axis in the direction of the conductive film 4. The pivot axis 12 of the pivot arm 14 is located in the immediate vicinity of the devices 24, 26, 28, 30 arranged frontally on the slide, so that the wire feed and adjustment device 20, which is attached to the extension arm 18 of the pivot arm 14 and which surrounds the free end 38 of the conductor 2, always has roughly the same radial distance from these devices 24, 26, 28, 30, regardless of the rotation of the pivot arm 14.

All named devices 8, 10, 14, 20, 22, 24, 26, 28, 30 and 31 of the device 1 are controlled by microprocessor-based numerical control (CNC), in which central control device 32 the data regarding the laying or printing structure of the conductor 2 on the conductive film 4 can be read via an input unit 34.

The starting point is an initial state of the device 1, in which a conductive film 4, on the surface of which the electrical connection points via the conductor are predetermined, together with the thermal isolation plate and, where appropriate, a copper block that serves as a power distribution device, is tensed on the cross table. Furthermore, an end 38 of the conductor 2 that is unwound a piece away from the conductor storage roll 16 is inserted into the wire feed and adjustment device 20. Ultimately, the data regarding the laying or printing structure of the conductor 2 on the conductive film 4 is read into the control device 32 via the input unit 34.

Against this background, the functioning of the device 1 is as follows: The control device 32 controls a control signal to the drive of the pivot arm 14 in order to position the conductor storage roll 16 at a right angle to the direction of the wire-printing or wire-laying. After this, the conductor 2 is positioned over the starting connection point 36 on the conductive film 4 by means of a corresponding drive of the X and Y axes of the cross table, as well as by means of a feed initiated with the help of the wire feed and adjustment device 20. After this, the insulation on the end 38 of the conductor 2 that represents a connection section is stripped by the stripping device 28, for example, by means of a laser beam 37 melting off in places the insulating jacket made of plastic on the conductor 2. Alternatively, naturally the stripping process can be finished first, followed by the positioning process. Then the slide 8 is driven along the vertical Z-axis and the welding head of the welding device 24 is lowered to the level of the beginning connection point. By activation of the welding head, the stripped end 38 of the conductor 2 is welded to the first connection point 36 and consequently non-detachably connected to the connection point arranged on the conductive film 4 or on the carrier film. This process is shown schematically in FIG. 2. Hereupon the rolls of the wire feed and adjustment device 20 are switched to have no drive and no torque, so that the conductor can move freely for further printing or laying, because the conductor 2 has already been fixed in place by means of the attachment to the connection point 36.

In order to drive to a further connection point of the conductive film 4, the cross table is driven accordingly by the control device 32 and in this way the conductor 2 is printed or laid on to the carrier film. Should changes in direction with respect to the shortest connection between the last connection point and the next connection point be necessary during the wire-printing, for example, in order to avoid having connection points through electronic components covered by the conductor 2, the drive of the cross table is deactivated and the conductor 2 is fixed in place on the conductive film by the gluing device 26, by means of the slide being driven along the Z-axis and the gluing device 26 being lowered to the level of the conductive film 4 in order to set a gluing point. This step is shown schematically in FIG. 3. Depending on the necessity, this step can also be repeated a number of times.

After the gluing has been completed, the conductor 2 is further printed on to the conductive film by means of driving the cross table, until the next connection point has been reached. There, in turn, the stripping device 28 and the welding device 24 are activated, in order to bring about an integral bond between the conductor 2 and the connection point. The named steps are repeated until an end connection point 40 has been reached. At this point, the insulation on a further connection section 46 of the conductor 2 is stripped by the stripping device 28 after the slide 8 has been lowered to the printed circuit board level, and said connection section 46 is non-detachably connected to the conductive film 4 by the welding device 24, as follows from FIG. 4. In order to grab the conductor 2 again, the previous effective freewheel of the rolls 22 of the wire feed and adjustment device 20 is lifted, as a result of which the conductor section 42 that extends between the end connection point 40 and the conductor storage roll 16 is prevented from rolling off, in an uncontrolled manner, the conductor storage roll 16 after being separated from the laid or printed conductor 44. Subsequently, the printed or laid conductor section 44 is separated from the remaining length assigned to the conductor storage roll 16 directly behind the end connection point 40 by the separating device 30, as shown in FIG. 5.

Instead of executing the wire-printing on to a continuous conductive film 4, it is also possible to transfer, for example to a carrier film, or otherwise to arrange and fix in place in a suitable manner even discrete connection structures and other conductive structures provided for laying on the surface of the printed circuit board to be produced later by means of connection to the circuit board support, and in this state of the wire-printing of the conductor 2 to pull it down, as a result of which a very large bandwidth of different connection structures and surface conductor structuring can be produced on a printed circuit board by means of connection to a printed board support.

According to the variant in which the wire-printing is done onto a continuous conductive film, the connection and conductance structures provided for connection and conductance purposes for arrangement on the printed circuit board surface are separated from one another and isolated with respect to one another after the laying or wire-printing of the conductor 2, for example, by means of an etching process, in order to work the connection points 36, 40 out of the copper film. Because these are, however, already known ahead of time according to the existing circuit layouts, the connections of the conductor 4 and the not yet discretised connection points 36, 40 can already be produced in advance. In addition, the surface of the conductive film 4, which has been given the conductor 2, can be given a stabilising and insulation cover layer, by, for example, pressing or encapsulating a prepreg of insulating material and reinforcement material with the conductive film 4 into a printed circuit board.

It is clear that the described functions can also be carried out by a device 1 that shows kinematics other than what has been described above. In particular, according to a further embodiment, the conductive film can, for example, be arranged in a stationary manner and all movements can be executed by a slide that can be driven in three axes.

Figure 6A:
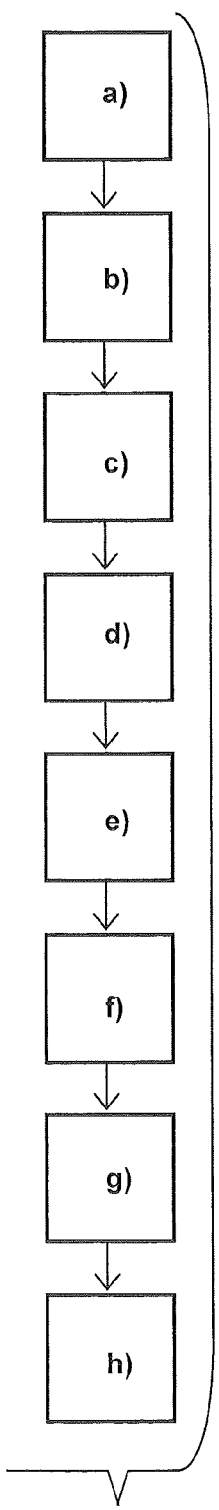
Figure 6B:
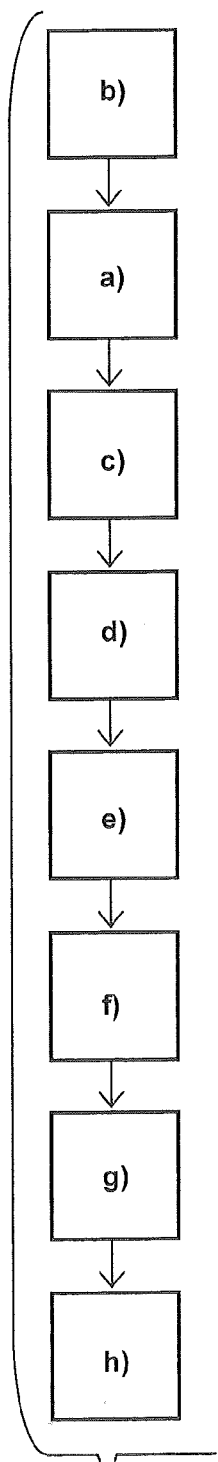
Figure 6C:
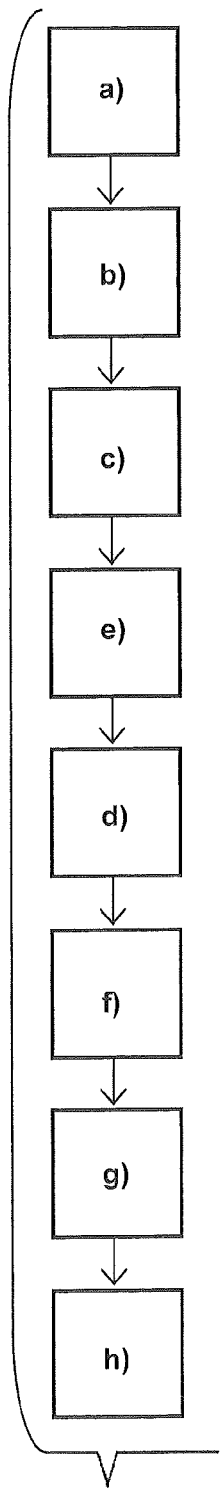
Figure 6D:
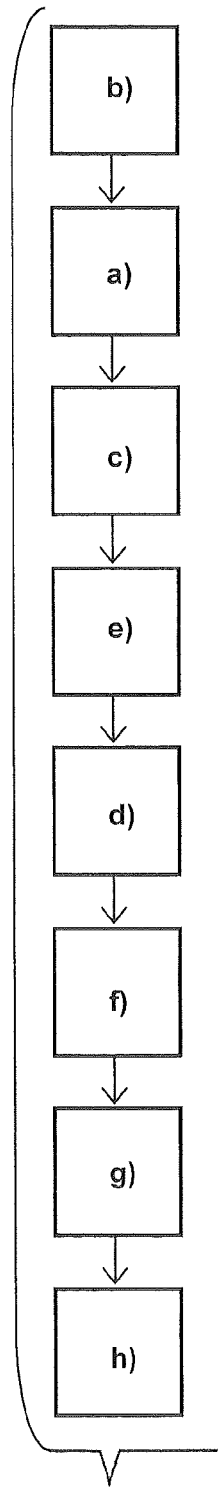

Further, the order of method steps a) through h) may be altered as described above. The resulting four different sequences are illustrated in, respectively, FIGS. 6A, 6B, 6C and 6D. FIG. 6A shows the steps in the alphabetized sequence, from step a) through step h) inclusive as described in the specification. FIG. 6B shows steps a) and b) reversed from the order of FIG. 6A; FIG. 6C shows steps d) and e) reversed from the order of FIG. 6A; and FIG. 6D shows steps a) and b) and steps d) and e) reversed from the order of FIG. 6A.

The invention claimed is:

1. Method for welding at least one wire conductor to electrical contact points disposed on a contact area of a conductive film to provide a wire-carrying conductive film adapted for connection to a circuit board support in order to produce a printed circuit board, the depth or diameter of the we conductor being greater than the thickness of the conductive film, the method comprising (a) conducting the welding in a welding area of the conductive film; (b) contacting the conductive film at least during the welding with a thermal isolation plate having a thermal conductivity which is lower than that of the conductive film; (c) removing the wire-carrying conductive film from the thermal isolation plate and then connecting the wire-carrying conductive film to a circuit board support; and (d) forming a printed circuit board by partially etching away the conductive film connected to the circuit board support to electrically isolate the electrical contact points.

2. Method for welding a conductor to a conductive film according to claim 1, wherein the thermal conductivity of the thermal isolation plate is, at least in a region adjacent the welding area, less than that of the conductive film by at least a factor of 2.

3. Method for welding a conductor to a conductive film according to claim 1, wherein the thermal isolation plate has a melting temperature and thermal stability, each of which is greater than that of the conductive film.

4. Method for welding a conductor to a conductive film according to claim 1, wherein the thermal isolation plate has a coating with at least one of a higher thermal stability and a lower thermal conductivity than does the circuit board support, at least in a region adjacent the welding area.

5. Method for welding a conductor to a conductive film according to claim 1, wherein the thermal isolation plate has an inert surface, at least in the welding area.

6. Method for welding a conductor to a conductive film according to claim 1, wherein the thermal isolation plate is electrically conductive.

7. Method for welding a conductor to a conductive film according to claim 1, wherein the thickness of the thermal isolation plate is greater than that of the conductive film by at least a factor of 5 and by no more than a factor of 300.

8. Method for welding a conductor to a conductive film according to claim 1, wherein the thermal isolation plate is arranged between the conductive film and a power distribution device.

9. Method for welding a conductor to a conductive film according to claim 1, wherein the depth or diameter of the conductor is greater than the thickness of the conductive film by a factor of from 2 to 10.

10. Method for welding a conductor to a conductive film according to claim 1, wherein a metallic component comprised of a metal that differs from at least one of the metal of the wire conductor and the metal, if any, of the board is introduced at the welding point.

11. Method for welding a conductor to a conductive film according to claim 1, wherein the wire conductor comprises at least two different metallic components.

12. Method for welding a conductor to a conductive film according to claim 1, wherein the welding is carried out by means of a contact welding method.

13. Method for welding a conductor to a conductive film according to claim 1, the method including disposing a counter-electrode and a welding electrode on respective opposite sides of the major plane of the board.

14. Method for welding a conductor to a conductive film according to claim 1, the method comprising disposing two welding electrodes with respect to the conductor.

15. Method for welding a conductor to a conductive film according to claim 1, the method comprising utilizing a counter-electrode formed as a surface electrode and a welding electrode having an isolation plate having a major plane, and disposing the counter-electrode on the same side of the major plane of the thermal isolation plate.

16. Method for welding a conductor to a conductive film according to claim 1, wherein the conductor is tensed and held down by a pressing device at least during the welding process.

17. Method for welding a conductor to a conductive film according to claim 1, wherein the conductor is an insulated conductor having insulation thereon, and the insulation is stripped off by means of at least one of thermal melting and mechanical removal.

18. Method for welding a conductor to a conductive film according to claim 17, wherein the thermal melting of the insulation is carried out by an electrode pair that is positioned relative to the conductor.

19. Method for welding a conductor to a conductive film according to claim 1, the method comprising disposing two welding-current-carrying electrodes between the conductive film and the thermal isolation plate on the same side of the major plane of the surface of the conductive film.

20. Method for welding a conductor to a conductive film according to claim 19, wherein the polarity direction of the two electrodes is periodically changed during the stripping.

21. Method for welding a conductor to a conductive film according to claim 19, wherein the two electrodes positioned relative to the conductor have the same polarity and are connected in parallel for continuous welding.

22. Method for welding a conductor to a conductive film according to claim 1, wherein the conductor is glued in spots to the conductive film with an adhesive.

23. Method for welding a conductor to a conductive film according to claim 22, wherein the adhesive is applied to the gluing spots by one or more of being dropped on, jetted on or sprayed on.

24. Method for welding a conductor to a conductive film according to claim 22, wherein the adhesive is one which requires activation and such activation is carried out by means of applying electromagnetic energy to the adhesive.

25. Method for the continuous laying of an insulated conductor between electrical contact points arranged on a conductive film by means of a numerically controlled device, the method comprising at least the following steps:
   a) Stripping the insulation off of the conductor at a connection section intended for connection to a beginning connection point;
   b) Moving the conductive film relative to at least the connecting section of the conductor, in order to position the connecting section of the conductor at the beginning connection point on the conductive film;
   c) Connecting the connecting section of the conductor to the beginning connection point;
   d) Moving the conductor relative to the conductive film while feeding a conductor length that is to be laid, in order to position a further connection section of the conductor at a further connection point on the conductive film;
   e) Stripping the insulation off of the connecting section of the conductor positioned at the further connection point;
   f) Connecting the connecting section of the conductor to the further connection point;
   g) Repeating steps d) to f) until such a time as the end connection point has been reached;
   h) Separating the laid length of conductor to free the conductive film for further movement; and
   i) After step g), transferring the conductive film to a circuit board support to form a printed circuit board by means of partially etching away the conductive film connected to the circuit board support to electrically isolate the areas forming the electrical contact points.

* * * * *